(12) United States Patent
Padron (10) Patent No.: US 10,284,830 B2
(45) Date of Patent: May 7, 2019

(54) 3D LASER PROJECTION OF PART LOCATIONS ONTO COMMUNICATION OR UTILITY POLES OR OTHER STRUCTURES

(71) Applicant: Sabre Communications Corporation, Sioux City, IA (US)

(72) Inventor: Leo Dan Padron, Springtown, TX (US)

(73) Assignee: Sabre Communications Corporation, Sioux City, IA (US)

( * ) Notice: Subject to any disclaimer, the term of this patent is extended or adjusted under 35 U.S.C. 154(b) by 0 days.

(21) Appl. No.: 15/975,875

(22) Filed: May 10, 2018

(65) Prior Publication Data

US 2018/0332260 A1 Nov. 15, 2018

Related U.S. Application Data

(60) Provisional application No. 62/505,504, filed on May 12, 2017.

(51) Int. Cl.
| | |
|---|---|
| *H04N 9/31* | (2006.01) |
| *G02B 27/20* | (2006.01) |
| *G01B 11/00* | (2006.01) |
| *G06F 17/50* | (2006.01) |

(52) U.S. Cl.
CPC ......... *H04N 9/3161* (2013.01); *G01B 11/002* (2013.01); *G02B 27/20* (2013.01); *G06F 17/50* (2013.01); *H04N 9/3194* (2013.01)

(58) Field of Classification Search
CPC .. G03B 21/14; G03B 21/147; G03B 21/2013; G03B 21/2033; H04N 9/3147; H04N 9/3161; H04N 9/3185; H04N 13/30; H04N 13/327; G06F 17/50; G06F 17/5004; G06F 17/5009
See application file for complete search history.

(56) References Cited

U.S. PATENT DOCUMENTS

| | | | |
|---|---|---|---|
| 6,547,397 B1 | 4/2003 | Kaufman et al. | |
| 6,965,690 B2* | 11/2005 | Matsumoto | G06T 17/10 345/420 |
| 2011/0169924 A1* | 7/2011 | Haisty | H04N 9/3147 348/51 |

* cited by examiner

*Primary Examiner* — Sultan Chowdhury
(74) *Attorney, Agent, or Firm* — Schwegman Lundberg & Woessner, P.A.

(57) ABSTRACT

Techniques that can overcome challenges for providing a virtual template for placing a part onto a utility or communication pole that includes twists that extend along at least a portion of a length of the pole. A user to use a laser pointer to trace along a corner between faces of a non-cylindrical pole, and feed that location registration information to the laser projection system to use in determining the location at which to place the virtual template on the utility or communication pole.

12 Claims, 5 Drawing Sheets

3D LASER PROJECTION OF PART LOCATIONS ONTO COMMUNICATION OR UTILITY POLES OR OTHER STRUCTURES

CLAIM OF PRIORITY

This application claims the benefit of priority of U.S. Provisional Patent Application Ser. No. 62/505,504, titled "3D LASER PROJECTION OF PART LOCATIONS ONTO COMMUNICATION OR UTILITY POLES OR OTHER STRUCTURES" to Leo Dan Padron, filed on May 12, 2017, the entire contents of which being incorporated herein by reference.

FIELD OF THE DISCLOSURE

This document pertains generally, but not by way of limitation, to manufacturing communication or utility poles.

BACKGROUND

Single-pole towers are used in the telecommunications and electric utilities industry. For example, such poles are used to support equipment for wireless phones and other communication devices as well as transmission lines and other electric utilities equipment.

Poles are designed generally to support the weight of the communications or electric utilities equipment originally installed on the pole, as well as to withstand forces exerted on the pole by environmental factors, such as wind and ice, for example.

Prior to installation, various components can be secured to a pole. For example, step clips and receptacles can be attached to the tower.

SUMMARY OF THE DISCLOSURE

The present inventor has recognized, among other things, that to accurately place the components, a laser projector can be used to project 3D laser outlines derived from a CAD file onto a 3D object, e.g., the pole, such as to replace a physical template with a virtual template to assist in locating a region on the 3D object.

In an aspect, this disclosure is directed to a method of using a laser projection system. The method comprises receiving, via the laser projection system, information generated from a tracing of points along a corner defined by an intersection of two faces of a multi-faced pole utility or communications pole; determining at least one measurement using the received information to determine a location at which to attach an object to the pole; registering a computer-assisted design (CAD) drawing to an image of the pole using the received information generated from the tracing of points; stretching at least a portion of the registered CAD drawing; and generating and projecting a virtual template of the object onto the pole using the stretched at least a portion of the CAD drawing.

In an aspect, this disclosure is directed to a method of using a laser projection system. The method comprises receiving, via the laser projection system, information generated from a tracing of points along a corner defined by an intersection of two faces of a utility or communications pole; determining at least one measurement using the received information to determine a location at which to attach an object to the pole; registering a computer-assisted design (CAD) drawing to an image of the pole by selecting from the received information generated from the tracing of points; adjusting at least a portion of the CAD drawing using the registered CAD drawing; and generating and projecting a virtual template of the object onto the pole using the adjusted at least a portion of the CAD drawing.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Communication or utility poles can be multi-faced, rather than cylindrical, with corners between faces on the pole. For example, a communication monopole can be extremely tall and can be 12, 16, or 18 sided. In addition, the poles can include twists that extend along at least a portion of its length. As mentioned above, prior to installation, various components can be secured to the pole. To accurately place the components, a laser projector can be used to project 3D laser outlines derived from a computer-assisted design (CAD) file onto a 3D object, e.g., the pole, such as to replace a physical template with a virtual template to assist in locating a region on the 3D object. An example of a laser projector that can be used is a FARO Tracer 3D Laser Projection System, available from FARO (www.faro.com), having headquarters in Lake Mary, Fla., USA.

It is the inventor's understanding that present limitations of such technology can include a need for placing reflective fiducial markers onto the 3D object. e.g., the pole, to determine a desired location at which the virtual template is to be projected onto the 3D object. Another limitation as understood by the present inventor is that the virtual template has limited capability, such as for projecting the virtual template onto a 3D cylinder, such as can require that such a cylinder has a constant radius, which is not the case in a multi-faced pole structure.

Such limitations can present challenges for use in the utility or communications industries, such as for providing a template for placing a part (e.g., a step clip) onto a utility pole that is multi-faced, rather than cylindrical, with corners between faces on the pole. In addition, the use of reflective fiducial markers on the 3D object can present challenges for providing a template for placing a part onto a utility pole that includes twists that extend along at least a portion of a length of the pole. Existing laser projection systems do not adequately compensate for twists along the length of the pole and, as such, do not accurately position the virtual templates.

The present inventor has recognized, among other things, that one solution that can avoid requiring (but can still permit) placing reflective fiducial markers onto the pole for registering the virtual template location can be to permit a user to use a laser pointer to trace along a corner between faces of the non-cylindrical pole, and feed that location registration information to the 3D Laser Projection System to use in determining the location at which to place the virtual template.

Figure 1:
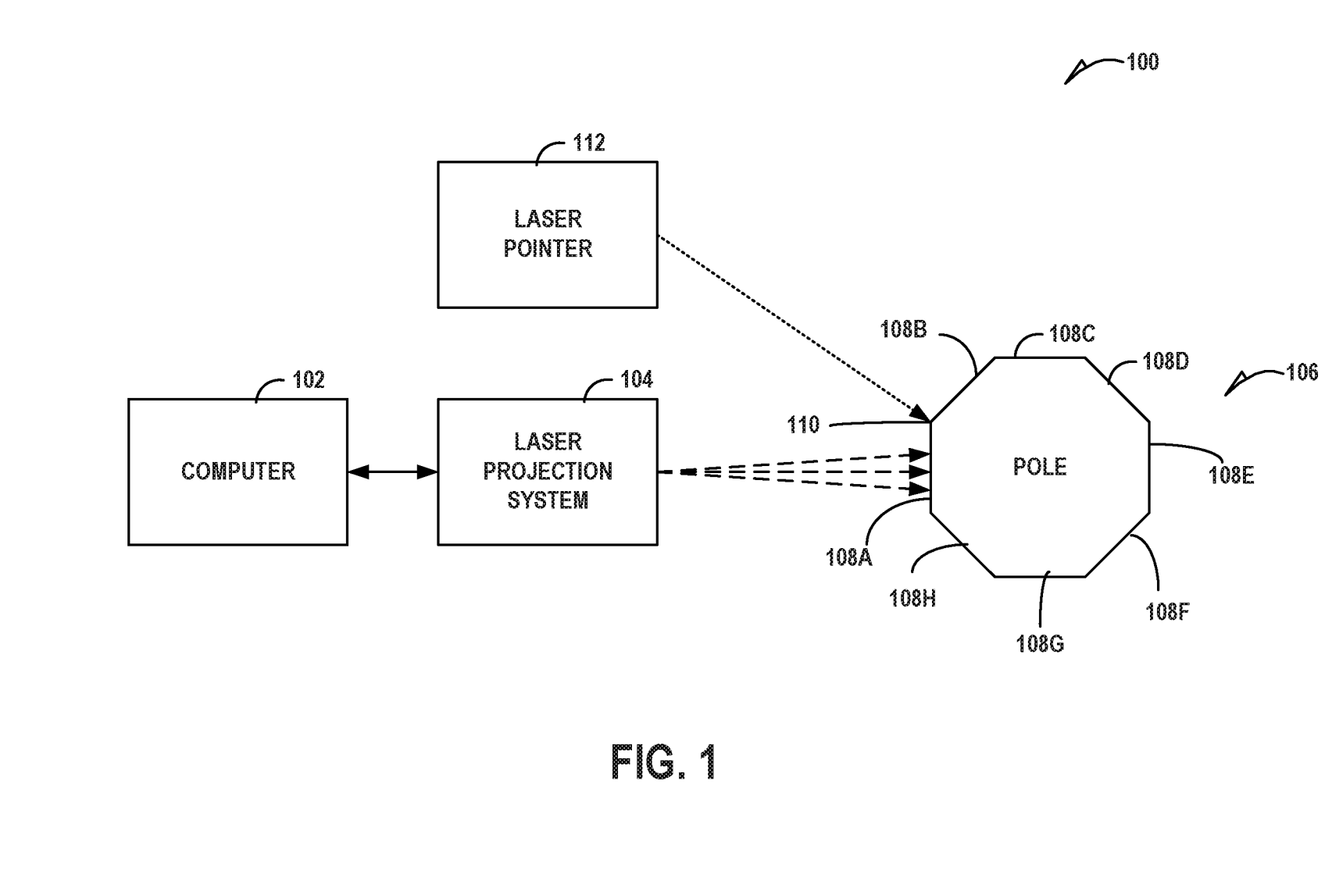
FIG. 1 a block diagram of an example of a system that can be used to implement various techniques of this disclosure.

FIG. 1 a block diagram of an example of a system 100 that can be used to implement various techniques of this disclosure. The system 100 can include a computer 102 coupled to a laser projection system 104. The computer 102 can store CAD files that include data representing 3D models, for example, of an object, such as a pole 106, which is depicted in cross-section in FIG. 1. The pole 106 can be a non-cylindrical pole or multi-faced pole, for example.

A laser projector of the laser projection system 104 can generate and project 3D laser outlines derived from a CAD file onto a 3D object. e.g., the pole 106, to position a virtual template that can assist in locating a region on the 3D object. An example a of laser projection system 104 is described in U.S. Pat. No. 6,547,397, titled "Apparatus and Method for Projecting a 3D Image", to Kaufman et al., and assigned to FARO TECHNOLOGIES. INC., the entire contents of which being incorporated herein by reference.

As seen in the FIG. 1, the pole 106 can include a number of faces 108A-108H (referred to collectively as faces 108), where adjacent faces 108 are joined by a corner. For example, faces 108A and 108B are joined by corner 110. In other words, a corner can be defined by an intersection of two faces.

Using existing techniques, a corner 110 can cause errors in the laser projection system 104.

In accordance with this disclosure, the system 100 can include a laser pointer 112 by which a user can trace points along a corner between faces of the non-cylindrical pole 106. Then, the traced information, e.g., location registration information, can be inputted into the laser projection system 104 for use in determining an offset, angle, or other distance measurement(s) for determining the location at which to place a part (e.g., a step receptacle) to be welded or otherwise attached to the pole, such as upon a face of the pole 106. In this manner, the system 100 can avoid hand measurements, and avoid requiring (but still permit) placing reflective fiducial markers onto the pole 106 for registering the virtual template location.

In a specific but non-limiting example, the user can view (e.g., on a computer monitor of the computer 102) a CAD drawing overlaid onto a camera-generated image (or a camera-generated image overlaid onto a CAD drawing) of a multi-faced utility pole present in the nearby surroundings of the system 100, such as in the same room. The user can use a computer mouse, for example, coupled to the computer 102 to click on locations on the displayed image of the pole 106.

In an example, the user can click on four registration points on the image of the pole, such as a first two-points along the same corner of the pole between faces, and a second two-points along another corner of the pole across the face from the first two-points. The system 100 can use these four registration points on the image of the pole to register the CAD drawing, such as to adjust, e.g., stretch, one or more portions of the CAD drawing to accommodate a spacing variation between pole corners 110, for example. Such adjustment, e.g., stretching, can leave other portions of the CAD drawing unstretched, so as to maintain their proportion.

In another example, the user can click on at least three registration points on the image to define a face: two points to define a corner and a line therebetween and a third point to define a width of the face, for example. In another example, the user can click on more than four registration points.

An example of this would be to stretch alignment lines on the CAD drawings corresponding to pole corners 110 in the image so that the step clip is appropriately centered between pole corners 110 without stretching the size of the CAD drawing features of the step clip being laser projected onto the actual physical pole. In this way, an appropriate size virtual template for locating the step clip can be generated with an appropriate size and proportion projected onto the physical pole. Repeating virtual templates can be projected onto the pole, such as at desired spacing increments (e.g., spacing between step clips), such as for appropriately placing and welding or otherwise attaching step clips onto the face of the physical pole.

Figure 2:
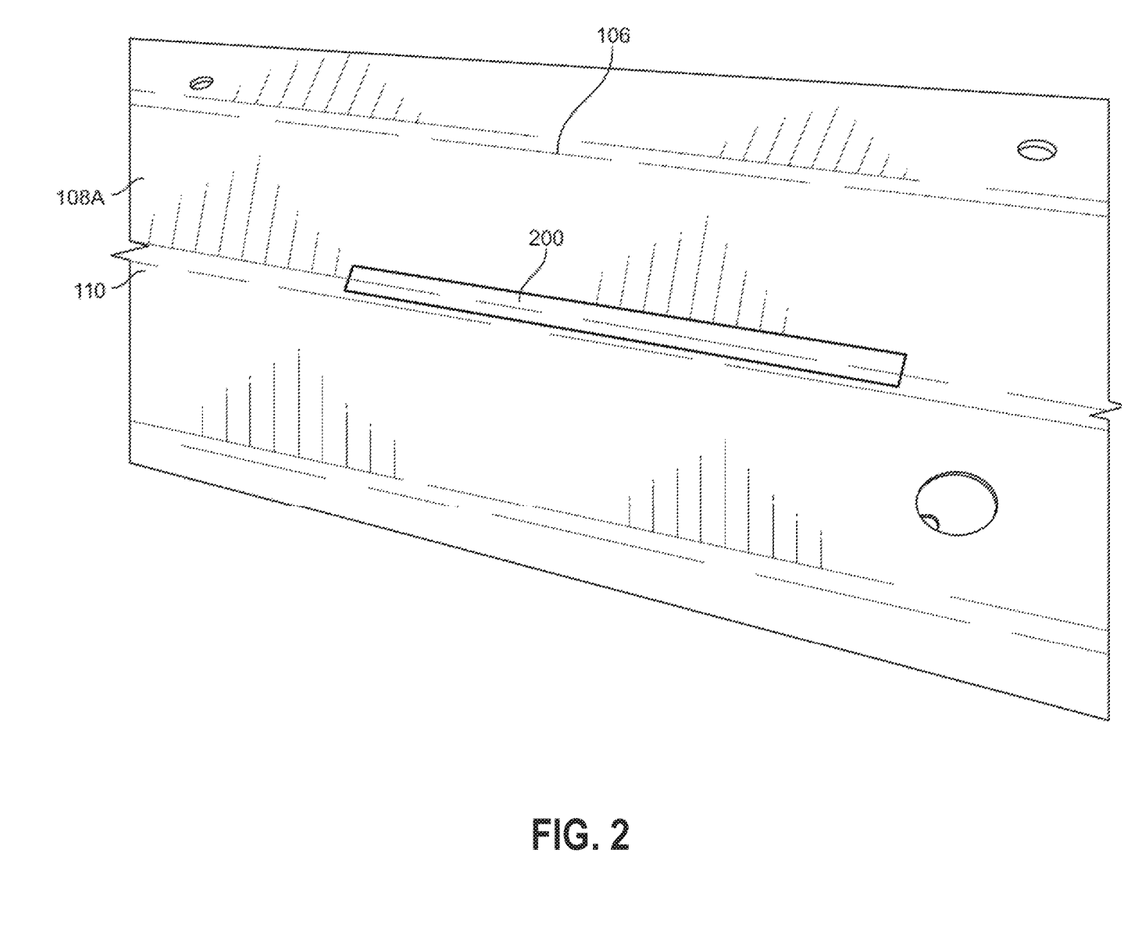
FIG. 2 shows an example of a virtual template projected onto a multi-faced utility pole, such as to assist in placement of one or more parts using the virtual template.

FIG. 2 shows an example of a virtual template projected onto a multi-faced utility pole, such as to assist in placement of one or more parts or objects (e.g., a step, a step-clip, a step receptacle, or the like) using the virtual template. The laser projected virtual template 200 is shown placed on a face 108A and adjacent a corner 110 of a pole 106.

Figure 3:
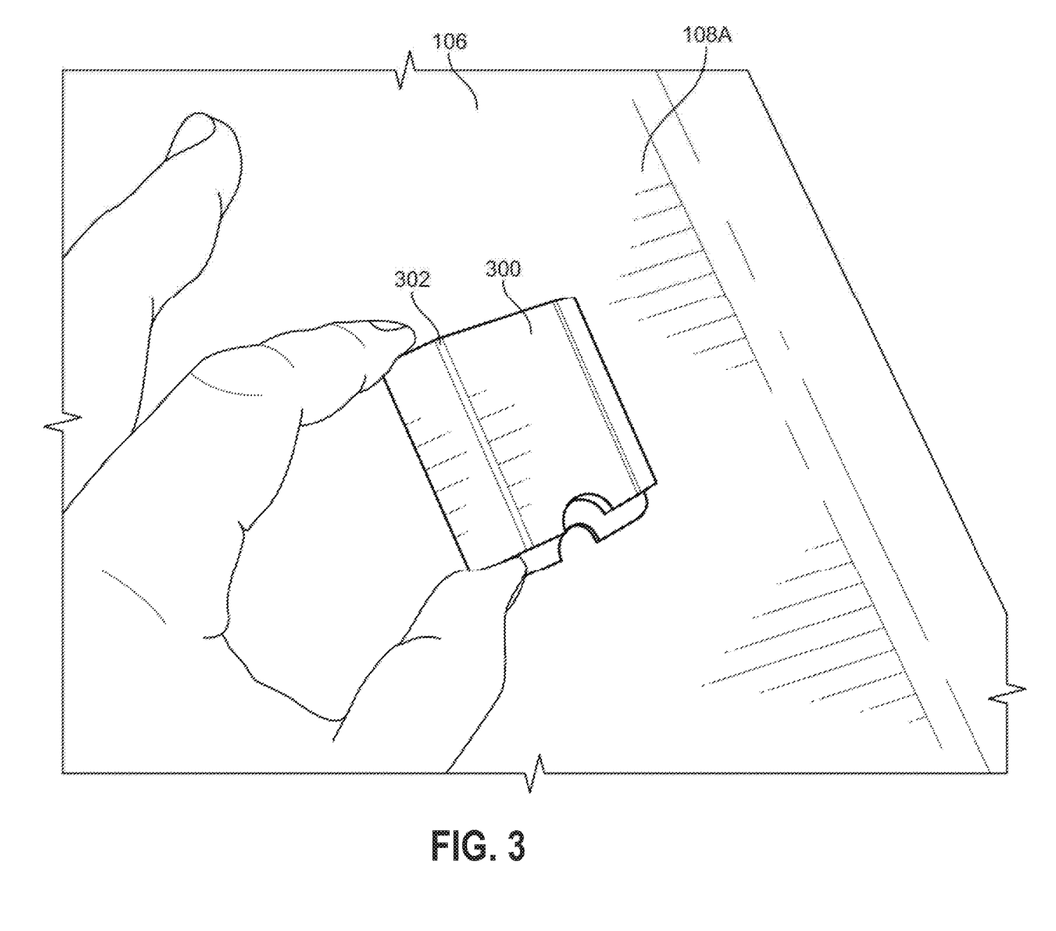
FIG. 3 shows an example of a step receptacle being placed onto a face of a multi-faced utility pole at a location at which a virtual template has been projected.

FIG. 3 shows an example of an object such as a step, a step-clip, or a step receptacle 300 being placed onto a face 108A of a multi-faced utility pole 106 at a location at which a laser projected virtual template 302 has been projected. In an example, the laser template can indicate an outline of a lower surface of the object, projected onto the face 108A. In this way, a user can place the object against the face 108A of the pole 106 such that an outline of the lower surface of the object aligns with the projected laser template of the lower surface of the object. After such placement of the object, the object can be welded or otherwise secured to the pole 106. Such placement can be carried out without requiring the user to perform physical measurements or using a physical template. Instead, the virtual template can allow proper placement of the objects, proper spacing between objects, and in so doing can help simplify the manufacturing process, can help lower the cost of manufacturing, and can help enhance the quality of the finished pole 106.

Figure 4:
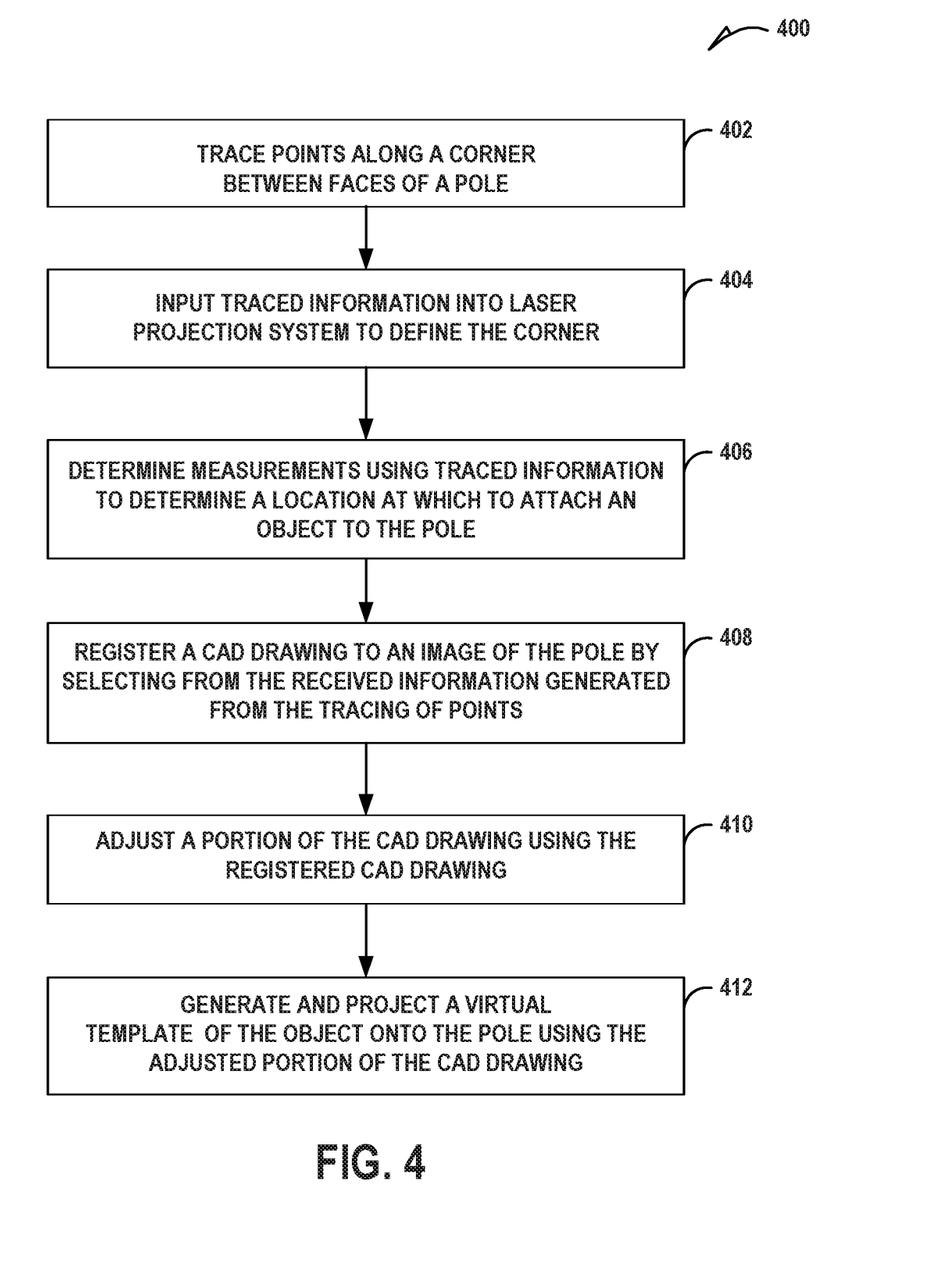
FIG. 4 is a flow diagram of an example of a method of using a laser projection system.

FIG. 4 is a flow diagram of an example of a method 400 of using a laser projection system, such as to assist in registering a physical location and orientation of the pole 106 to a CAD drawing, without requiring the placement and use of physical reflective fiducial markers onto the pole 106, if so desired. At block 402, the method 400 can include tracing points along a corner between faces of a pole. For example, referring to FIG. 1, a user can use a laser pointer 112 to trace along a corner 110 between faces 108A and 108B of the pole 106. At block 404, the method 400 can include inputting the traced information from using the laser pointer into a laser projection system, e.g., laser projection system 104 of FIG. 1.

At block 406, the method 400 can include determining one or more measurements using the traced information to determine a location at which to attach an object to the pole.

For example, the laser projection system 104 of FIG. 1 can determine one or more of an offset, angle, or other distance measurement(s) to determine a location at which to place a part (e.g., a step receptacle) to be welded or otherwise attached to the pole, such as upon a face of the pole.

At block 408, the method 400 can include registering a CAD drawing to an image of a physical pole by selecting from the received information generated from the tracing of point, e.g., from at least two locations along a first corner between faces of the pole traced using the laser pointer. For example, to register the CAD drawings, a user can use a computer mouse (or other input device) coupled to a computer, e.g., computer 102 of FIG. 1, to click on or otherwise select locations representing registration points on a CAD drawing overlaid onto a camera-generated image of the pole on a display of the computer. In an example, the user can click on two registration points on the image of the pole, such as a first two-points along the same corner of the pole between faces. In another example, the user can click on a second two-points along another corner of the pole across the face from the first two-points.

At block 410, the method 400 can include adjusting a portion of the CAD drawing using the registered CAD drawing, e.g., the registration points. For example, the computer 102 of FIG. 1, can use these two or more registration points on the image of the pole to register the CAD drawing, such as to adjust, e.g., stretch, one or more portions of the CAD drawing to accommodate a spacing variation between pole corners 110. Such adjustment. e.g., stretching, can leave other portions of the CAD drawing unstretched, so as to maintain their proportion. In an example implementation, adjusting a portion of the CAD drawing using the registration points can include stretching one or more portions of the CAD drawing to accommodate a dimension produced by the selected locations on the image of the physical pole At block 412, the method 400 can include generating and projecting a virtual template of the object, e.g., step receptacle, onto the pole, using the adjusted portion of the CAD drawing. For example, the method can include projecting a virtual template onto a utility or communications pole. e.g., a non-cylindrical pole or multi-faced pole. In some example implementations, projecting a virtual template onto the pole can include using the registered CAD drawing to project the virtual template onto the physical pole using information from the registration between the image of the physical pole and the CAD drawing.

Figure 5:
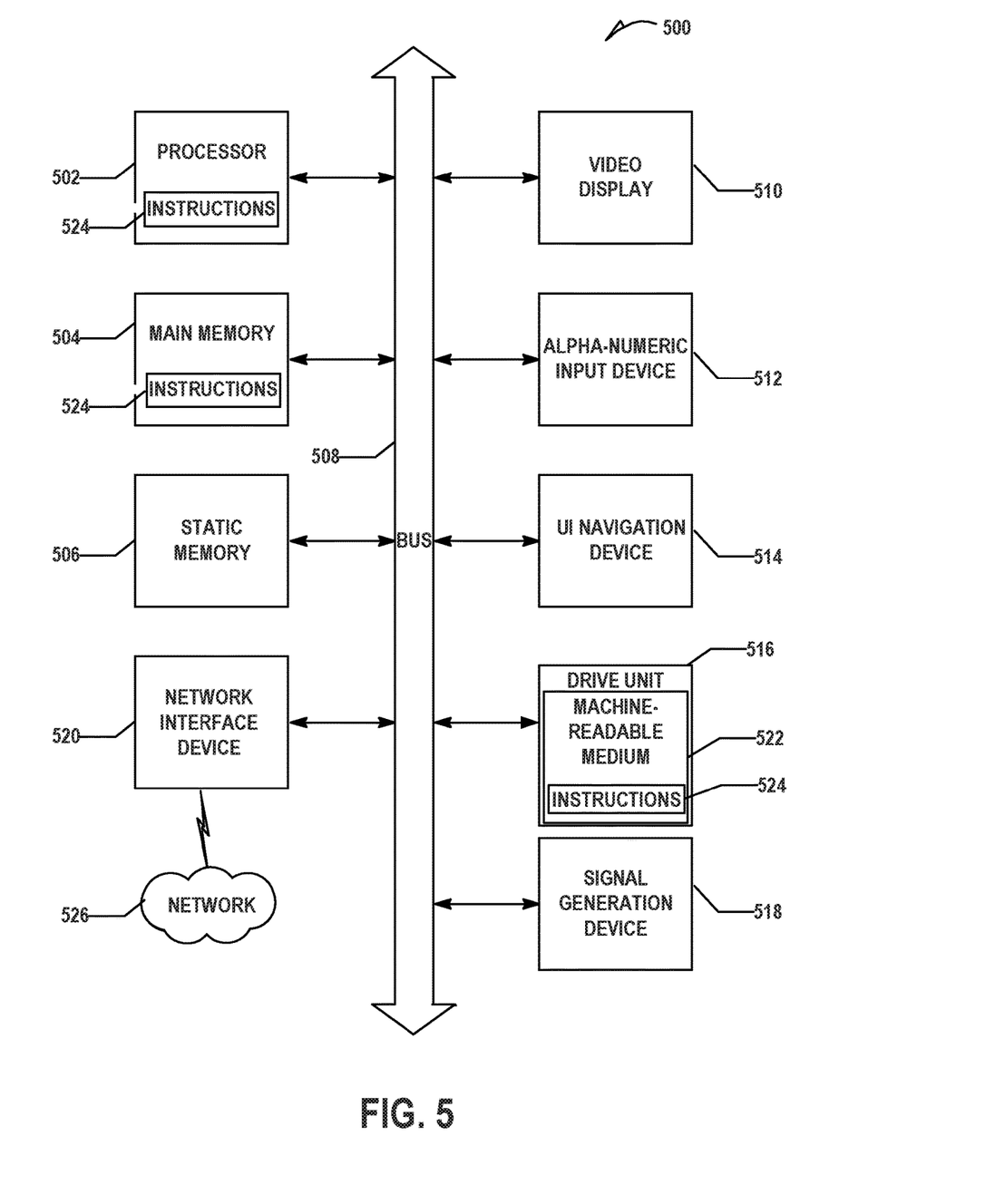
FIG. 5 is a block diagram illustrating an example machine upon which any one or more of the techniques (e.g., methodologies) discussed herein may be performed, according to an example embodiment.

FIG. 5 is a block diagram illustrating a machine in the example form of a computer system 500, within which a set or sequence of instructions may be executed to cause the machine to perform any one of the methodologies discussed herein, according to an example embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be an onboard vehicle system, wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 500 includes at least one processor 502 (e.g., a central processing unit (CPU), a graphics processing unit (GPU) or both, processor cores, compute nodes, etc.), a main memory 504 and a static memory 506, which communicate with each other via a link 508 (e.g., bus). The computer system 500 may further include a video display unit 510, an alphanumeric input device 512 (e.g., a keyboard), and a user interface (UI) navigation device 514 (e.g., a mouse). In one embodiment, the video display unit 510, input device 512 and UI navigation device 514 are incorporated into a touch screen display. The computer system 500 may additionally include a storage device 516 (e.g., a drive unit), a signal generation device 518 (e.g., a speaker), a network interface device 520, and one or more sensors (not shown), such as a global positioning system (GPS) sensor, compass, accelerometer, or other sensor.

The storage device 516 includes a machine-readable medium 522 on which is stored one or more sets of data structures and instructions 524 (e.g., software) embodying or utilized by any one or more of the methodologies or functions described herein. The instructions 524 may also reside, completely or at least partially, within the main memory 504, static memory 506, and/or within the processor 502 during execution thereof by the computer system 500, with the main memory 504, static memory 506, and the processor 502 also constituting machine-readable media.

While the machine-readable medium 522 is illustrated in an example embodiment to be a single medium, the term "machine-readable medium" may include a single medium or multiple media (e.g., a centralized or distributed database, and/or associated caches and servers) that store the one or more instructions 524. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media.

Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 524 may further be transmitted or received over a communications network 526 using a transmission medium via the network interface device 520 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third." etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of using a laser projection system, the method comprising:
   receiving, via the laser projection system, information generated from a tracing of points along a corner defined by an intersection of two faces of a multi-faced pole utility or communications pole;
   determining at least one measurement using the received information to determine a location at which to attach an object to the pole;
   registering a computer-assisted design (CAD) drawing to an image of the pole using the received information generated from the tracing of points;
   stretching a first portion of the registered CAD drawing while leaving a second portion of the registered CAD drawing unstretched;
   generating a virtual template of the object using the registered CAD drawing including the stretched first portion and the unstretched second portion;
   determining a location on the pole to project the virtual template of the object based on the at least one measurement; and
   projecting the virtual template of the object onto the location on the pole.

2. The method of claim 1, further comprising:
   securing at least one physical object on the utility or communications pole at the location.

3. The method of claim 1, wherein projecting the virtual template of the object onto the location on the pole includes:
   projecting repeating virtual templates onto the pole.

4. A method of using a laser projection system, the method comprising:
   receiving, via the laser projection system, information generated from a tracing of points along a corner defined by an intersection of two faces of a utility or communications pole;
   determining at least one measurement using the received information to determine a location at which to attach an object to the pole;
   registering a computer-assisted design (CAD) drawing to an image of the pole by selecting from the received information generated from the tracing of points;
   adjusting a first portion of the CAD drawing while leaving a second portion of the registered CAD drawing unadjusted;

generating a virtual template of the object using the registered CAD drawing including the adjusted first portion and the unadjusted second portion;

determining a location on the pole to project the virtual template of the object based on the at least one measurement; and projecting the virtual template of the object onto the location on the pole.

5. The method of claim 4, wherein projecting the virtual template of the object onto the pole includes:

projecting the virtual template of the object onto a non-cylindrical pole.

6. The method of claim 4, wherein projecting the virtual template of the object onto the pole includes:

projecting the virtual template of the object onto a multi-faced pole.

7. The method of claim 4, wherein registering the computer-assisted design (CAD) drawing to an image of the pole by selecting from the received information generated from the tracing of points includes:

registering the CAD drawing to an image of the pole by selecting at east two locations along a first corner between faces of the pole.

8. The method of claim 7, wherein registering the CAD drawing includes selecting at least two locations along a second corner between faces of the pole, the second corner being across a face from the first corner.

9. The method of claim 8, wherein adjusting the first portion of the CAD drawing includes:

stretching the first portion of the CAD drawing to accommodate a dimension produced by the selected locations on the image of the pole.

10. The utility or communications pole manufactured using the method of claim 4.

11. The method of claim 4, further comprising:

securing at least one physical object on the utility or communications pole at the location.

12. The method of claim 4, wherein projecting the virtual template of the object onto the location on the pole includes:

projecting repeating virtual templates onto the pole.

* * * * *

UNITED STATES PATENT AND TRADEMARK OFFICE
CERTIFICATE OF CORRECTION

| | | |
|---|---|---|
| PATENT NO. | : 10,284,830 B2 | Page 1 of 1 |
| APPLICATION NO. | : 15/975875 | |
| DATED | : May 7, 2019 | |
| INVENTOR(S) | : Leo Dan Padron | |

It is certified that error appears in the above-identified patent and that said Letters Patent is hereby corrected as shown below:

In the Claims

In Column 10, Line 2, in Claim 7, delete "east" and insert --least-- therefor

Signed and Sealed this
Twenty-first Day of April, 2020

Andrei Iancu
*Director of the United States Patent and Trademark Office*